United States Patent
Weber

(10) Patent No.: US 9,518,877 B2
(45) Date of Patent: Dec. 13, 2016

(54) MICROMECHANICAL COMPONENT FOR A CAPACITIVE SENSOR DEVICE, AND MANUFACTURING METHOD FOR A MICROMECHANICAL COMPONENT FOR A CAPACITIVE SENSOR DEVICE

(71) Applicant: Robert Bosch GmbH, Stuttgart (DE)

(72) Inventor: Heribert Weber, Nuertingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/478,117

(22) Filed: Sep. 5, 2014

(65) Prior Publication Data

US 2015/0061049 A1    Mar. 5, 2015

(30) Foreign Application Priority Data

Sep. 5, 2013   (DE) .................. 10 2013 217 726

(51) Int. Cl.
*H01L 21/00* (2006.01)
*G01L 1/14* (2006.01)
(Continued)

(52) U.S. Cl.
CPC ............... *G01L 1/148* (2013.01); *B81B 3/007* (2013.01); *G01L 9/0073* (2013.01);
(Continued)

(58) Field of Classification Search
CPC .... G01L 9/0042; G01L 9/0073; G01L 9/0045; G01L 9/0047; G01L 9/005; G01L 9/0019; G01L 9/0072; G01L 9/12; G01L 1/148; G01L 19/0076; B81B 2201/0264; B81B 2203/0127; B81B 2203/0315; B81B 7/0041; B81B 7/0058; B81B 7/0077; B81B 7/02; B81B 2207/095; B81B 3/0021; B81C 1/00246; B81C 1/00158; B81C 1/00333; B81C 1/00182; B81C 1/00047; B81C 1/00476; B81C 2203/0136; B81C 2203/0145; B81C 2203/019; B81C 2201/0109; B81C 2201/053; H01L 2924/1461; H01L 2924/19041; H01L 2924/30105; H01L 29/84; H01L 29/66007; H01L 29/41; H01L 21/30604; H01L 21/6835; H01L 21/763; H01L 21/764; H01L 41/1132; H01L 41/1138; H01G 5/16; H05K 7/02
(Continued)

(56) References Cited

U.S. PATENT DOCUMENTS 6,156,585 A *  12/2000  Gogoi ................... G01L 9/0073
                                                          438/48
6,167,761 B1 *   1/2001  Hanzawa .............. G01L 9/0073
                                                         361/283.4
(Continued)

FOREIGN PATENT DOCUMENTS

EP        0 714 017         5/1996

*Primary Examiner* — Julio J Maldonado
*Assistant Examiner* — Cory Eskridge
(74) *Attorney, Agent, or Firm* — Norton Rose Fulbright US LLP

(57) ABSTRACT

A micromechanical component for a capacitive sensor device includes first and second electrodes. The first electrode is at least partially formed from a first semiconductor layer and/or metal layer, and at least one inner side of the second electrode facing the first electrode is formed from a second semiconductor layer and/or metal layer. A cavity is between the first and second electrodes. Continuous recesses are structured into the inner side of the second electrode and sealed off with a closure layer. At least one reinforcing layer of the second electrode and at least one contact element which is electrically connected to the first electrode, to the (Continued)

layer of the second electrode which forms the inner side, to at least one printed conductor, and/or to a conductive substrate area, are formed from at least one epi-polysilicon layer. Also described is a micromechanical component manufacturing method for a capacitive sensor device.

16 Claims, 14 Drawing Sheets

(51) Int. Cl.
    *H01L 29/66*     (2006.01)
    *G01L 9/00*     (2006.01)
    *B81B 3/00*     (2006.01)

(52) U.S. Cl.
    CPC   *H01L 29/66007* (2013.01); *B81B 2201/0235* (2013.01); *B81B 2201/0264* (2013.01)

(58) Field of Classification Search
    USPC .. 438/53, 50, 51, 52, 48, 702, 127, 24, 703, 438/705, 745, 977; 257/415, 419, 417, 257/414, 254, 108, 420, 448, 459, 534, 257/622; 73/724, 718, 754, 514.32, 777, 73/31.06, 335.04; 361/283.4, 283.1; 216/2; 324/661
    See application file for complete search history.

(56) References Cited

U.S. PATENT DOCUMENTS

| | | | |
|---|---|---|---|
| 6,892,582 B1* | 5/2005 | Satou | B81C 1/00293 361/283.1 |
| 2009/0194309 A1* | 8/2009 | Gillot | B81B 3/007 174/50 |

* cited by examiner

MICROMECHANICAL COMPONENT FOR A CAPACITIVE SENSOR DEVICE, AND MANUFACTURING METHOD FOR A MICROMECHANICAL COMPONENT FOR A CAPACITIVE SENSOR DEVICE

RELATED APPLICATION INFORMATION

The present application claims priority to and the benefit of German patent application no. 10 2013 217 726.7, which was filed in Germany on Sep. 5, 2013, the disclosure of which is incorporated herein by reference.

FIELD OF THE INVENTION

The present invention relates to a micromechanical component for a capacitive sensor device, and a capacitive sensor device. Moreover, the present invention relates to a manufacturing method for a micromechanical component for a capacitive sensor device, and for a capacitive sensor device.

BACKGROUND INFORMATION

A micromechanically manufacturable pressure sensor is discussed in EP 0 714 017 A1. The pressure sensor has a doped area of a substrate as the first electrode, and has a membrane layer as the second electrode, the membrane layer spanning a cavity which at least partially exposes the doped area of the substrate. Continuous recesses for exposing the cavity beneath the membrane layer are structured into the membrane layer, and are sealed off with the aid of a closure layer. Additional layers may optionally be applied to the closure layer.

SUMMARY OF THE INVENTION

The present invention provides a micromechanical component for a capacitive sensor device having the features described herein, a capacitive sensor device having the features described herein, a manufacturing method for a micromechanical component for a capacitive sensor device having the features described herein, and a manufacturing method for a capacitive sensor device having the features described herein.

SUMMARY OF THE INVENTION

The present invention allows joint/simultaneous production of the at least one reinforcing layer (as the outer side) of the second electrode and the at least one contact element. The present invention thus contributes to simplified manufacturability of the micromechanical component for a capacitive sensor device. Due to the at least one reinforcing layer of the second electrode which is producible with little additional effort, the second electrode may be reinforced/stiffened in such a way that bulging of the second electrode into the cavity situated between the electrodes occurs only under a fairly strong action of pressure and/or force on the second electrode. A capacitive sensor device equipped with the micromechanical component is thus usable for ascertaining/detecting fairly high pressures/forces. In particular, the capacitive sensor device which is configured as a pressure sensor and which includes the micromechanical component according to the present invention may advantageously be used for measuring high pressures.

If only a single epi-polysilicon layer is used for (simultaneously) forming the at least one reinforcing layer and the at least one contact element, at least one subarea of the closure layer which seals off the continuous recesses and at least one surface/contact surface of a line component and/or an electrode component contacted by the at least one contact element are covered with the aid of the single epi-polysilicon layer. Otherwise, if at least two epi-polysilicon layers are deposited for (simultaneously) forming the at least one reinforcing layer and the at least one contact element, the sealing subarea of the closure layer and the at least one surface/contact surface of a line component and/or an electrode component contacted by the at least one contact element are covered with the aid of the innermost of the at least two epi-polysilicon layers.

The joint/simultaneous production of the at least one reinforcing layer (as the outer side) of the second electrode and the at least one contact element may be carried out using simple method steps. The present invention thus implements a micromechanical component for a capacitive sensor device which is easily manufacturable in a cost-effective manner.

As explained in greater detail below, due to the joint/simultaneous production of the at least one reinforcing layer of the second electrode and the at least one contact element, method steps customarily carried out for this purpose may be dispensed with.

The micromechanical component according to the present invention has the further advantage that the achievable layer structure composed of the two electrodes with the cavity situated in between, the at least one reinforcing layer, and the at least one contact element has a comparatively small extension and a small distance between electrodes perpendicular to the surfaces of the electrodes. The micromechanical component which is implementable according to the present invention may thus provide a large capacity, and at the same time, small lateral dimensions, and thus allows a sensitive and accurate measurement, such as a pressure measurement.

In one advantageous specific embodiment, the second electrode includes at least one stress compensation layer which is situated between the layer of the second electrode which forms the inner side and the at least one reinforcing layer, and through which the continuous recesses are structured. A mechanical stress which is introduced into the second electrode may thus be reliably compensated for. Undesirable bulging/buckling of the second electrode may be prevented in this way.

In addition, the micromechanical component may include at least two epi-polysilicon layers as the at least one epi-polysilicon layer, whereby at least one stress compensation layer may be situated between two adjacent epi-polysilicon layers. Thus, the occurrence of mechanical stress in the at least two epi-polysilicon layers may also be compensated for in such a way that undesirable bulging/buckling of the second electrode is reliably avoidable.

In another advantageous specific embodiment, the micromechanical component also includes an intermediate electrode which is situated between the first electrode and the second electrode. In this case, the micromechanical component may advantageously be used for a pressure sensor, whereby in particular both electrodes may be acted on by the pressure to be measured/tested. This allows a high level of measuring accuracy and measuring sensitivity during a pressure measurement. Alternatively, the two electrodes may also be acted on by different pressures.

The micromechanical component may include a first substrate having a top side which is at least partially covered by an insulating layer, the first electrode being situated on the insulating layer. Alternatively or additionally, the micromechanical component may also include a second substrate which is affixed to the at least one epi-polysilicon layer via at least one bonded, soldered, and/or glued connection. Numerous options for the configuration of the micromechanical component having at least one substrate are thus possible, which allows a comparatively high level of design freedom.

The above-described advantages are also ensured with a capacitive sensor device which includes this type of micromechanical component.

Likewise, the above-described advantages are achievable by carrying out the corresponding manufacturing method for a micromechanical component for a capacitive sensor device. The manufacturing method may be refined according to the above-described specific embodiments of the micromechanical component.

Furthermore, such a manufacturing method for a capacitive sensor device also achieves the above-described advantages. The manufacturing method for a capacitive sensor device may also be correspondingly refined.

Further features and advantages of the present invention are explained below with reference to the figures.

DETAILED DESCRIPTION

Figure 1A:
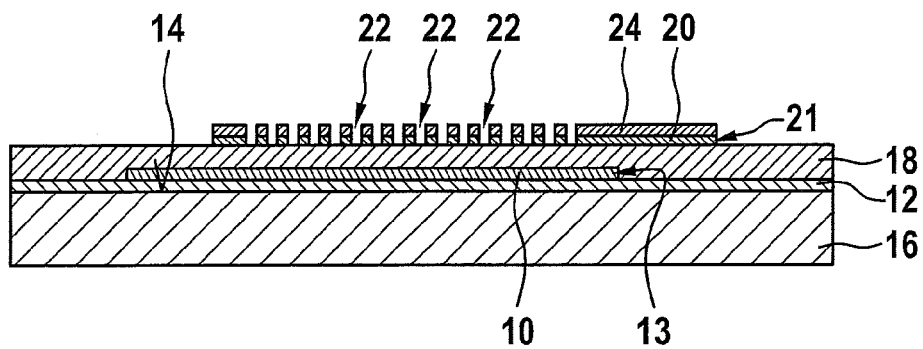
FIGS. 1a, 1b, 1c, and 1d show schematic cross sections for explaining a first specific embodiment of the manufacturing method for a micromechanical component.

FIGS. 1a through 1d show schematic cross sections for explaining a first specific embodiment of the manufacturing method for a micromechanical component.

For manufacturing the micromechanical component, initially a first electrode 10 is formed. In this specific embodiment of the manufacturing method, first electrode 10 is formed on at least one first (electrical) insulating layer 12 which is situated at least partially on a top side 14 of a (first) substrate 16. For forming first electrode 10, a first semiconductor layer and/or metal layer 13, such as a silicon layer, is deposited and structured. In particular, first electrode 10 may be structured out of a first polysilicon layer as first semiconductor layer and/or metal layer 13. A first electrode 10 which contains a semiconductor material may be doped to increase the electrical conductivity of the first electrode.

Substrate 16 may contain at least one semiconductor material such as silicon. In particular, substrate 12 [sic; 16] may be a semiconductor substrate such as a silicon substrate. With the aid of at least one doping, substrate 16 may also be formed with conductive areas and electrical circuit components (not illustrated).

First (electrical) insulating layer 12 may include an oxide layer, a nitride layer, and/or an oxide-nitride layer. First insulating layer 12 may be made of (thermal) silicon oxide. In addition, first insulating layer 12 may also have a multilayer structure composed of oxide, nitride, and/or oxide-nitride.

At least one second (electrical) insulating layer 18 is deposited above first electrode 10 in a further method step. Second insulating layer 18 may be deposited over the entire surface. Second insulating layer 18 may also include an oxide layer, a nitride layer, and/or an oxide-nitride layer. For example, second insulating layer 18 may have a multilayer structure composed of oxide, nitride, and/or oxide-nitride. Second insulating layer 18 may be made of silicon oxide.

An inner side of a layer 20 of a second electrode which faces first electrode 10 is subsequently formed on second insulating layer 18. For this purpose, a second semiconductor layer and/or metal layer 21 is/are deposited on second insulating layer 18. Second semiconductor layer and/or metal layer 21 may in particular be a polysilicon layer. In addition, a layer which contains a semiconductor material and which represents layer 20 of the second electrode which forms the inner side may be doped to improve the electrical conductivity of the second electrode. Furthermore, continuous recesses 22 are structured through layer 20 of the second electrode which forms the inner side.

A plurality of continuous recesses 22 may be structured through layer 20 of the second electrode which forms the inner side. In particular, layer 20 of the second electrode which forms the inner side may be formed as a lattice- and/or mesh-shaped structure with the aid of continuous recesses 22. For example, web- and/or strand-shaped sections of the lattice- and/or mesh-shaped structure may have a width (oriented in parallel to top side 14) between 0.1 μm and 2 μm. In particular, the web- and/or strand-shaped sections of the lattice- and/or mesh-shaped structure may be oriented at right angles and/or at an inclined angle with respect to one another. In addition, continuous recesses 22 may have a width (oriented in parallel to top side 14) between 0.1 μm and 2 μm. The configuration of the lattice- and/or mesh-shaped structure may thus be selected relatively freely. Layer 20 of the second electrode which forms the inner side may thus be configured in particular as a close-mesh lattice structure.

In the specific embodiment in FIGS. 1a through 1d, (prior to structuring layer 20 which forms the inner side), layer 20 of the second electrode which forms the inner side is at least partially covered by at least one stress compensation layer 24. Continuous recesses 22 are structured through layer 20 which forms the inner side, and stress compensation layer 24. Layer 20 which forms the inner side, as well as stress compensation layer 24, may thus be structured using the same mask. An additional mask plane may therefore be dispensed with.

A mechanical stress which may possibly be introduced into the second electrode may be compensated for by forming stress compensation layer 24. Thus (even if continuous recesses 22 are sealed off later), undesirable bulging/buckling of the second electrode is reliably preventable.

FIG. 1a shows a cross section of substrate 16 after structuring layer 20 of the second electrode which forms the inner side, and stress compensation layer 24.

After structuring at least layer 20 of the second electrode which forms the inner side, a cavity 26 is formed between first electrode 10 and layer 20 of the second electrode which forms the inner side by etching off a subarea of at least second insulating layer 18. The etching off of the subarea of at least second insulating layer 18 takes place through continuous recesses 22 in layer 20 of the second electrode which forms the inner side. In contrast to conventional etching processes (such as sacrificial oxide etching processes through etching channels with access in the edge area of a membrane), in the manufacturing method described here, in particular for the lattice- and/or mesh-shaped structure of layer 20 which forms the inner side, there is thus no need for long etching paths for undercutting layer 20 of the second electrode which forms the inner side. Cavity 26 may thus be formed more quickly than in a conventional etching process through an etching channel having long undercut paths. In particular, due to the positions and/or widths (oriented in parallel to top side 14 of substrate 16) of continuous recesses 22, it may also be ensured that inner side 20 of the second electrode, which may be referred to as the undercut membrane, has sufficient membrane stability during formation of cavity 26. Likewise, due to the positions and/or widths of continuous recesses 22, an etching time required for forming cavity 26 and a minimum thickness of closure layer 28 for securely closing continuous recesses 22 may be set relatively freely. For example, due to a relatively small distance between two adjacent continuous recesses 22 and comparatively small widths of continuous recesses 22, the etching time may be selected to be short, and required closure layer 28 may be selected to be thin.

Cavity 26 between first electrode 10 and layer 20 of the second electrode which forms the inner side is advantageously formed by etching off the subarea of at least second insulating layer 18 with the aid of an isotropic oxide plasma etching step. Thus, etching with the aid of HF or HF vapor is not necessary for removing the partial material of at least second insulating layer 18. In addition, special equipment in the form of an HF gas phase etching system is therefore not required for forming cavity 26. Furthermore, with alternative wet etching in BOE or liquid HF for forming cavity 26, there is no concern for sticking of the exposed membrane structure on first electrode 10.

Figure 1B:
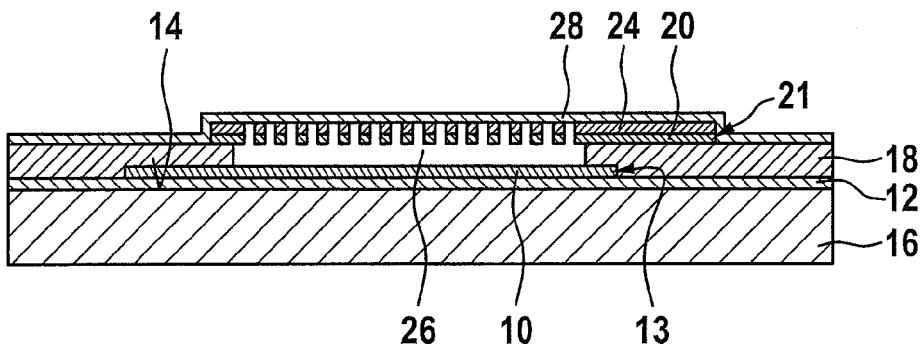

After cavity 26 is formed, continuous recesses 22 in layer 20 of the second electrode which forms the inner side are sealed off with the aid of a covering closure layer 28. The intermediate product thus obtained is illustrated in FIG. 1b.

Closure layer 28 may be, for example, a silicon oxide layer, a silicon nitride layer, a silicon oxide-nitride layer, or a multilayer system composed of the mentioned layers. Continuous recesses 22 may also be sealed air-/gas-tight with the aid of such a closure layer 28. A thickness of closure layer 28 may be selected depending on the width of covered continuous recesses 22.

Figure 1C:
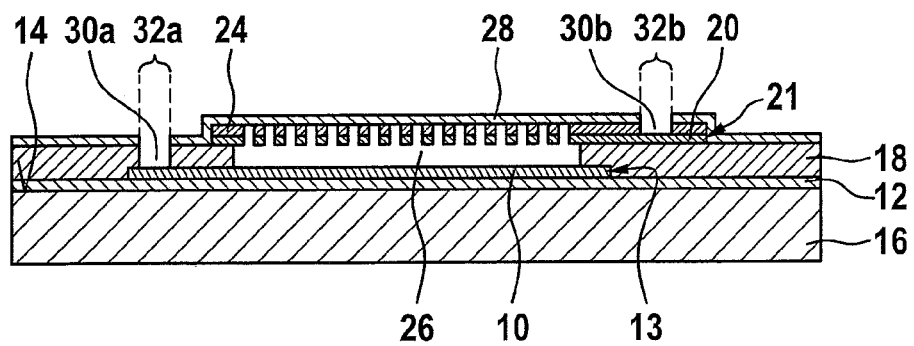

In a method step schematically depicted in FIG. 1c, contact openings 30a and 30b may be subsequently structured through closure layer 28, (optional) stress compensation layer 24, and/or first and/or second (electrical) insulating layer 12 or 18 in such a way that a subsurface 32a is exposed on first electrode 10, a subsurface 32b is exposed on layer 20 of the second electrode which forms the inner side, a subsurface is exposed on an (optional) first printed conductor composed of first semiconductor layer and/or metal layer 13, a subsurface is exposed on an (optional) second printed conductor composed of second semiconductor layer and/or metal layer 21, and/or a subsurface is exposed on an (optional) conductive substrate area.

By a suitable selection of the materials of layers 18, 24, and/or 28 it may be ensured that contact openings 30a and 30b are formable at the same time. For forming contact openings 30a and 30b, an oxide plasma etching process, for example, may be carried out which stops on the surfaces to be contacted or has only a very low etching removal rate on same. Due to the simultaneous structuring of contact openings 30a and 30b, mask planes which are usually required for contacting conductive components in different layer planes may be dispensed with.

In another method step, at least one reinforcing layer 34 of second electrode 36 and at least one contact element 38a and 38b, which is connected to first electrode 10, to layer 20 which forms the inner side of second electrode 36, to (optional) first printed conductor composed of first semiconductor layer and/or metal layer 13, to (optional) second printed conductor composed of second semiconductor layer and/or metal layer 21, and/or to an (optional) conductive substrate area, are formed. The at least one reinforcing layer 34 of second electrode 36 and the at least one contact element 38a and 38b are formed from at least one epi-polysilicon layer 40. The at least one reinforcing layer 34 of second electrode 36 and the at least one contact element 38a and 38b are thus formed either from a single epi-polysilicon layer 40 [or] from at least two epi-polysilicon layers 40. If only single epi-polysilicon layer 40 is used for (simultaneously) forming reinforcing layer 34 and the at least one contact element 38a and 38b, at least one subarea 42 of closure layer 28 which seals off continuous recesses 22 (in layer 20 which forms the inner side of second electrode 36) and at least one subsurface 32a and 32b of first electrode 10, of layer 20 which forms the inner side of second electrode 36, of the (optional) first printed conductor, of the (optional) second printed conductor, and/or of the (optional) conductive substrate area via which the at least one contact opening 30a and 30b is exposed, are covered with the aid of single epi-polysilicon layer 40. Otherwise, at least sealing subarea 42 of closure layer 28 and the at least one subsurface 32a and 32b of first electrode 10, of layer 20 which forms the inner side of second electrode 36, of the (optional) first printed conductor, of the (optional) second printed conductor, and/or of the (optional) conductive substrate area, are covered with the aid of the innermost of the at least two epi-polysilicon layers 40.

Optionally, after being deposited, the at least one epi-polysilicon layer 40 may be planarized with the aid of a chemical mechanical polishing (CMP) process. The at least one reinforcing layer 34 and the at least one contact element 38a and 38b may be selectively structured out of the at least one epi-polysilicon layer 40 with the aid of at least one separating trench 44. During the structuring of the at least one epi-polysilicon layer 40, closure layer 28 situated thereebeneath or, if closure layer 28 has been previously structured, second insulating layer 18, may be used as a stop layer. However, the at least one reinforcing layer 34 may also remain connected in one piece to a contact element 38a and 38b. A layer stress of the at least one reinforcing layer 34 may be specified in such a way that compensation of stress compensation layer 24, and thus also buckling of second electrode 36, which may be configured as a membrane, is not able to occur after the continuous recesses are closed.

Figure 1D:
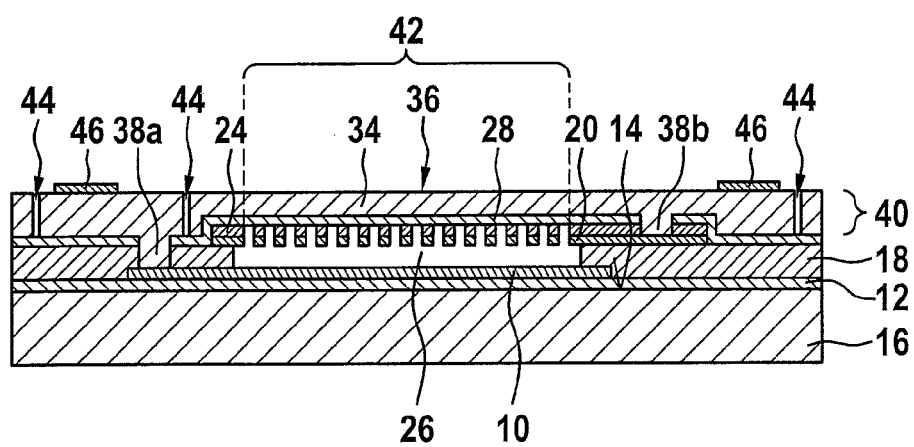

The method step schematically depicted in FIG. 1d thus allows the joint/simultaneous production of the at least one reinforcing layer 34 and the at least one contact element 38a and 38b. In particular, as illustrated in FIG. 1d, multiple contact elements 38a and 38b may be produced at the same time, regardless of the height/position of contacted subsurfaces 32a and 32b. Thus, contact elements 38a and 38b for the conductive components situated in different layer planes may also be formed at the same time with the aid of this method step.

The at least one epi-polysilicon layer 40 as well may have a conductive, in particular highly conductive, configuration as the result of appropriate doping. In addition, (additional) electrical insulating layers, printed conductors, and/or bond pads 46, made of aluminum, for example, may be situated on a surface/outer surface of the at least one epi-polysilicon layer 40. A voltage and/or a signal at contact elements 38a and 38b may thus be easily and reliably supplied or tapped.

The stiffness/flexibility of second electrode 36 may be easily set to a desired value via the selected thickness of the at least one closure layer 34. In particular, the specific forces to which the two electrodes 10 and 36 respond as the result of a change in capacitance at their contact elements 38a and 38b may be specified in this way. For example, a capacitive pressure sensor may thus also be configured for measuring fairly high pressures.

As described above, at least two/multiple epi-polysilicon layers (as the at least one epi-polysilicon layer 40) may be deposited. As a refinement, at least one stress compensation layer may also be deposited between two adjacent epi-polysilicon layers.

In one refinement of the manufacturing method, an intermediate insulating layer may be deposited on first electrode 10 even before second insulating layer 18 is deposited. An intermediate electrode which is at least partially covered by second insulating layer 18 may be subsequently formed on the intermediate insulating layer. Specific embodiments of a micromechanical component which is manufacturable in this way are described in greater detail below.

Figure 2:
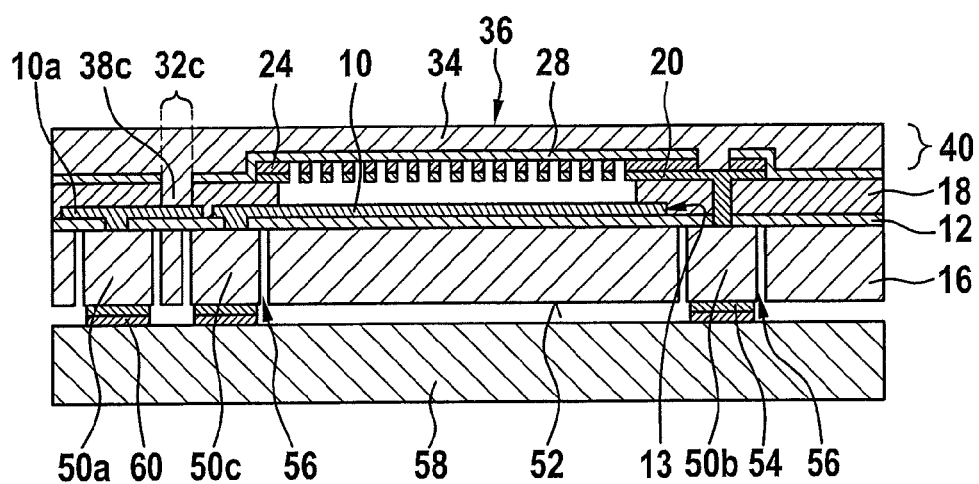
FIG. 2 shows a schematic cross section for explaining a second specific embodiment of the manufacturing method for a micromechanical component.

FIG. 2 shows a schematic cross section for explaining a second specific embodiment of the manufacturing method for a micromechanical component.

In the manufacturing method in FIG. 2, in addition to first electrode 10, (at least) one first printed conductor 10a is also formed from first semiconductor layer and/or metal layer 13. Optionally, (at least) one second printed conductor (not illustrated) may also be structured out of second semiconductor layer and/or metal layer 21. First printed conductor 10a and/or the second printed conductor may each contact a conductive substrate area 50a or 50b. However, instead of the second printed conductor, inner side 20 of second electrode 36 which is at least partially formed from second semiconductor layer and/or metal layer 21 may contact a conductive substrate area 50b. In addition, first electrode 10 may be electrically connected to a conductive substrate area 50c. Conductive substrate areas 50a through 50c may be doped substrate areas and/or trenches (vias, for example) which are filled with a conductive material.

In addition, a contact element 38c which is electrically connected to a subsurface 32c of first printed conductor 10a may be formed with the aid of the at least one epi-polysilicon layer 40. Similarly, a contact element (not illustrated) for a subsurface of the second printed conductor may also be formed from the at least one epi-polysilicon layer 40, and substrate 16 may subsequently be selectively thinned by grinding and CMP. A bond layer 54, a germanium layer, for example, may be subsequently deposited and structured on a rear side 52 of substrate 16 facing away from electrodes 10 and 36, which may be on conductive substrate areas 50a through 50c. With the aid of insulation trenches 56, conductive substrate areas 50a through 50c of substrate 16 may subsequently be opened up so that they are usable as insulated contact elements.

Rear side 52 of (first) substrate 16 may subsequently be bonded to an additional substrate 58 via a further bond layer 60. The bond connection between substrates 16 and 58 may be a eutectic bond connection, in particular made of aluminum-germanium. However, instead of a bond connection, (first) substrate 16 may also be affixed to additional substrate 58 with the aid of at least one solder ball and/or a (conductive) adhesive. The finished micromechanical component may thus be easily contacted at its rear side 52 facing away from electrodes 10 and 36.

Figure 3A:
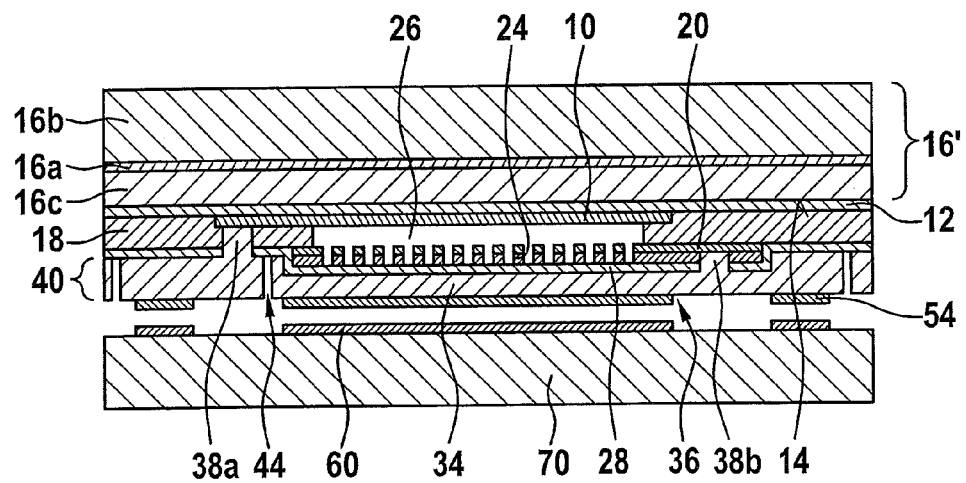
FIGS. 3a and 3b show schematic cross sections for explaining a third specific embodiment of the manufacturing method.
Figure 3B:
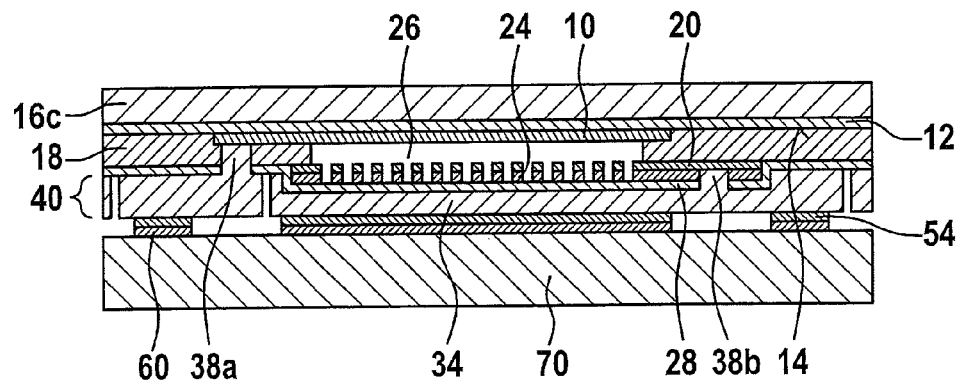

FIGS. 3a and 3b show schematic cross sections for explaining a third specific embodiment of the manufacturing method.

The method steps schematically illustrated with reference to FIGS. 3a and 3b may be explained as a supplement to the manufacturing method in FIGS. 1a through 1d. As schematically illustrated in FIG. 3a, initially a second substrate 70 is affixed to the at least one epi-polysilicon layer 40 via at least one bonded, soldered, and/or (conductive) glued connection. For example, eutectic bonding with the aid of layers 54 and 60, or alternatively, sealglass bonding using an electrically conductive sealglass, may be carried out. In addition, aluminum alloys such as aluminum-silicon-copper, aluminum-silicon, or aluminum-copper may be used in the bond system. It is pointed out in particular that a material of second substrate 70 may also be used as bond material.

As an advantageous refinement, in addition to contact elements 38a and 38b, a bonded, soldered, and/or (conductive) glued connection to second substrate 70 may also be formed at the at least one reinforcing layer 34 of second electrode 36, as the result of which second electrode 36 may be selectively stiffened or connected to second substrate 70.

As may also be seen in FIG. 3, first substrate 16b may be removed after affixing second substrate 70 via the at least one bonded, soldered, and/or (conductive) glued connection to the at least one epi-polysilicon layer 40. In this case, in particular use of an SOI wafer 16' as substrate 16 is advantageous, since a silicon oxide layer 16a of SOI wafer 16' is also usable as an etch stop during the removal process for substrate layer 16b. First electrode 10 may thus be configured as a bendable membrane whose elasticity/flexibility is settable in a defined manner via the thickness of a semiconductor layer 16c of SOI wafer 16'.

A micromechanical component which is manufactured with the aid of the above-described manufacturing method may be used for a capacitive sensor device. The advantages listed above are also ensured for the capacitive sensor device, in particular for a pressure sensor.

The micromechanical components explained below are also manufacturable with the aid of the above-described manufacturing method. However, it is pointed out that the manufacturability of the micromechanical components described below is not limited to strict adherence to the method steps listed above.

Figure 4:
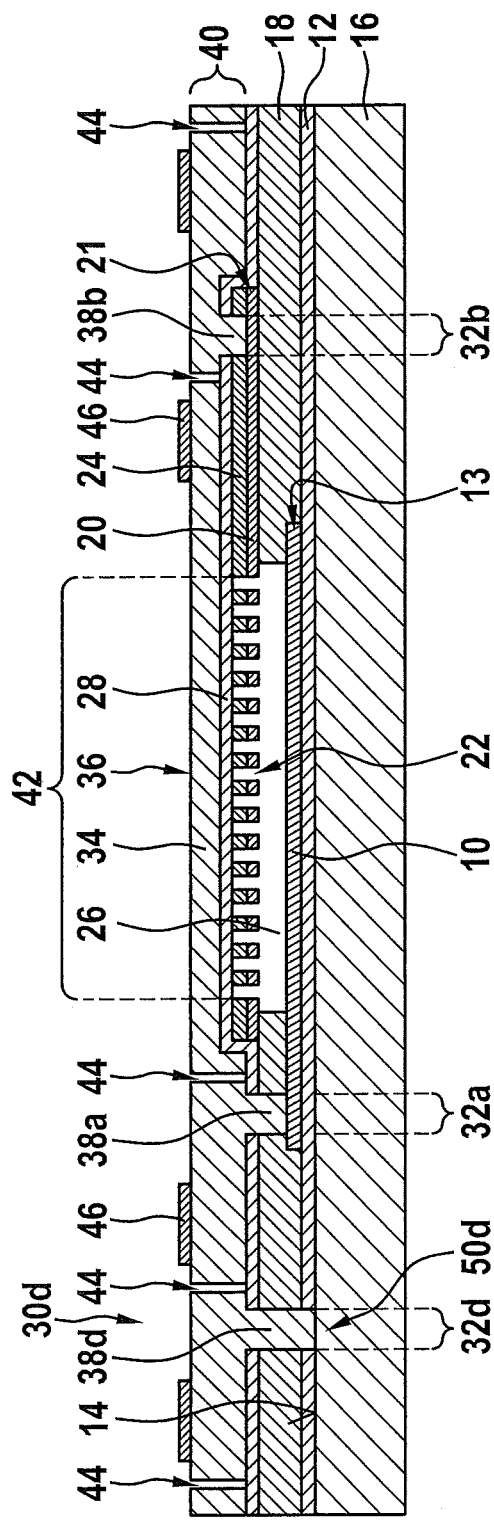
FIG. 4 shows a schematic cross section of a first specific embodiment of the micromechanical component.

FIG. 4 shows a schematic cross section of a first specific embodiment of the micromechanical component.

The micromechanical component in FIG. 4 includes a first electrode 10 and a second electrode 36, second electrode 36 being suspended at a distance from first electrode 10 in such a way that a cavity 26 is present between first electrode 10 and second electrode 36. First electrode 10 may be situated at a distance from a substrate 16 with the aid of a first insulating layer 12. Electrodes 10 and 36 may be situated at a desired electrode distance from one another with the aid of a second insulating layer 18 which may optionally be structured so that second insulating layer 18 is situated only in the area of electrodes 10 and 36. In addition, with the aid of second insulating layer 18, electrodes 10 and 36 may be electrically insulated from one another in such a way that a capacitor which is formed from electrodes 10 and 36 is usable for a capacitive sensor device. As described above, for this purpose, subareas of second insulating layer 18 may be used as sacrificial material for forming cavity 26.

First electrode 10 is at least partially formed from a first semiconductor layer and/or metal layer 13. In addition, at least one inner side 20 of second electrode 36 facing first electrode 10 may be formed from a second semiconductor layer and/or metal layer 21. Continuous recesses 22 which are sealed off with the aid of a closure layer 28 are structured into layer 20 which forms the inner side of second electrode 36.

In addition, second electrode 36 also has at least one reinforcing layer 34. The at least one reinforcing layer 34 and at least one contact element 38a, 38b, and 38d which is electrically connected to first electrode 10, to layer 20 which forms the inner side of second electrode 36, to an (optional) first printed conductor composed of first semiconductor layer and/or metal layer 13, to an (optional) second printed conductor composed of second semiconductor layer and/or metal layer 21, and/or to an (optional) conductive substrate area 50d, is formed from at least one epi-polysilicon layer 40. This is carried out in such a way that at least one subarea 42 of closure layer 34 which seals off continuous recesses 22 in layer 20 which forms the inner side of second electrode 36 and at least one subsurface 32a, 32b, and 32d of first electrode 10 which is opened up by a contact opening 30a, 30b, and 30d, of layer 20 which forms the inner side of second electrode 36, of the (optional) first printed conductor, of the (optional) second printed conductor, and/or of (optional) conductive substrate area 50d, are covered with the aid of epi-polysilicon layer 40 or with the aid of the innermost of the at least two epi-polysilicon layers 40.

At least one of contact elements 38a, 38b, and 38d may be structured out of the at least one epi-polysilicon layer 40 with the aid of at least one trench 44. In the specific embodiment in FIG. 4, the at least one reinforcing layer 34 is insulated from all contact elements 38a, 38b, and 38d with the aid of the at least one trench 44. The at least one reinforcing layer 34 may thus also be used as an EMC shield for second electrode 36, via which interference signals may be kept away from actual useful signals. The at least one reinforcing layer 34 may thus be used not only for reinforcing second electrode 36, but also for electrical shielding. It is pointed out that no additional effort is involved for simultaneously producing the EMC shield together with contact elements 38a, 38b, and 38d. In particular, it is not necessary to increase the number of listed etching steps and the number of masks used.

Second electrode 36 is a multilayer system composed of at least layers 20, 28, and 34. The layer stack of second electrode 36 advantageously also includes at least one stress compensation layer 24 situated between layer 20 which forms the inner side of second electrode 36 and the at least one reinforcing layer 34. Continuous recesses 22 are also structured through the at least one stress compensation layer 34. Undesirable bulging/buckling of second electrode 36, which may be referred to as a membrane, may be prevented with the aid of the at least one stress compensation layer 24. In addition, the two electrodes 10 and 36 may be prevented from sticking together during the manufacturing process with the aid of the at least one stress compensation layer 24. Second electrode 36 may thus be configured as a self-supporting structure without concern for pressure stresses deflecting layer 20, which forms the inner side, from its intended position. The at least one stress compensation layer 24 may be a silicon nitride layer, for example. In particular, the at least one stress compensation layer 24 may be configured as an LPCVD layer.

In addition, a desired stiffness/membrane stability of second electrode 36 may be ensured with the aid of the at least one reinforcing layer 34. The capacitor which is formed from electrodes 10 and 36 may thus also be used in a capacitive sensor device for testing/detecting fairly high pressures and/or forces. The at least one reinforcing layer 34 may have a layer thickness between 1 μm and 100 μm, for example.

First electrode 10 may be structured out of a first semiconductor layer and/or metal layer 13. Layer 20 which forms the inner side of second electrode 36 may be formed from a second semiconductor layer and/or metal layer 21. First semiconductor layer and/or metal layer 13 and/or second semiconductor layer and/or metal layer 21 may be polysilicon layers. By doping a semiconductor layer and/or metal layer 13 and/or 21 which contain(s) a semiconductor material, good conductivity of components 10 and 20 formed therefrom may be ensured. In addition, the at least one epi-polysilicon layer 40 may be conductive as the result of suitable doping.

In one refinement not shown, the micromechanical component may include at least two epi-polysilicon layers as the at least one epi-polysilicon layer 40. In this case, at least one stress compensation layer (not illustrated) may be situated between two adjacent epi-polysilicon layers. Undesirable bulges of second electrode 36 may be prevented in this way as well.

Figure 5:
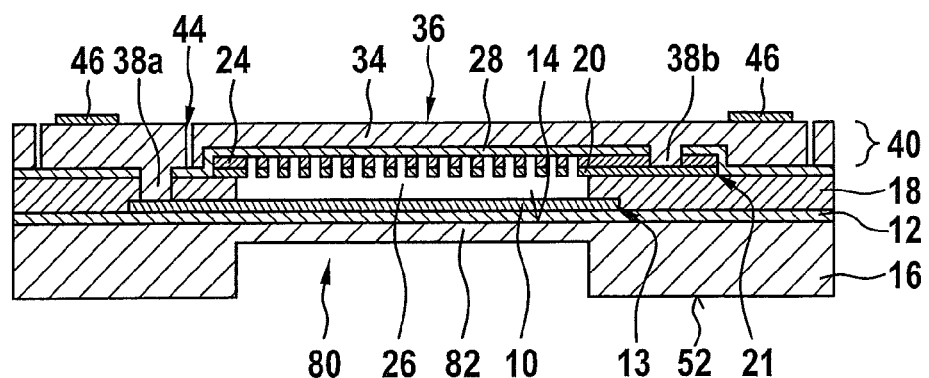
FIG. 5 shows a schematic cross section of a second specific embodiment of the micromechanical component.

FIG. 5 shows a schematic cross section of a second specific embodiment of the micromechanical component.

The micromechanical component schematically illustrated in FIG. 5 has a recess 80, on a rear side 52 of substrate 16 (facing away from electrodes 10 and 36) in the area of first electrode 10, in which substrate 16 is thinned to a comparatively thin membrane layer 82. Membrane layer 82 is situated at a distance from first electrode 10 with the aid of first insulating layer 12. With the aid of recess 80 it is possible to provide first electrode 10 with a membrane characteristic. Thus, first electrode 10 may also be concavely curved via a force exerted thereon or by an action of pressure into cavity 26. Stiffness of first electrode 10 is settable via a layer thickness of membrane layer 82 which may be reliably adjusted using a time-controlled plasma etching process. Thus, a membrane property of first electrode 10 may advantageously be established over the period of time used for structuring recess 80.

The micromechanical component schematically illustrated in FIG. 5 is advantageously usable in particular as a pressure sensor. Since both electrodes 10 and 36 have membrane properties and may be acted on by the pressure that is present in their outer surroundings, an increase in the pressure measurement sensitivity of the capacitor formed from electrodes 10 and 36 is achievable.

Figure 6:
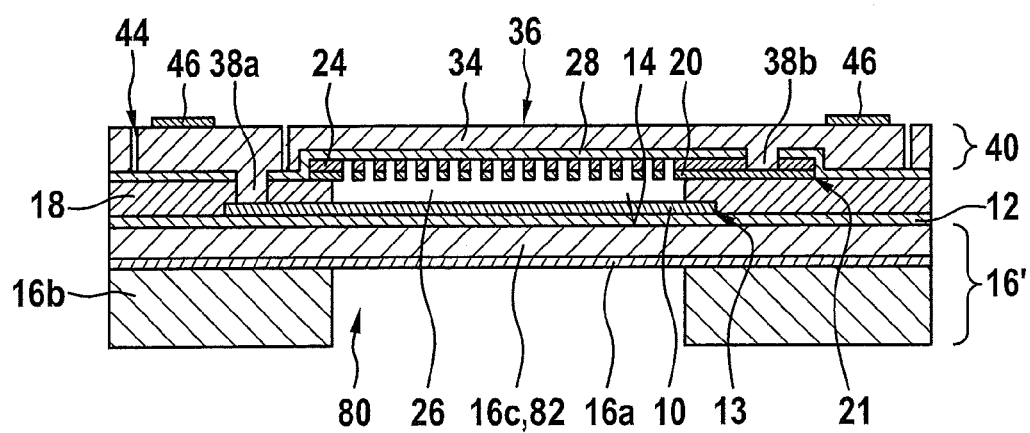
FIG. 6 shows a schematic cross section of a third specific embodiment of the micromechanical component.

FIG. 6 shows a schematic cross section of a third specific embodiment of the micromechanical component.

The component schematically illustrated in FIG. 6 is produced from an SOI wafer 16'. Silicon oxide layer 16a of SOI wafer 16' may thus be used as an etch stop layer during etching of recess 80. A homogeneous distribution of the etching depth and membrane thickness over substrate 16' is thus achievable. Optionally, exposed silicon oxide layer 16a may be removed after recess 80 is produced.

Semiconductor layer 16c of SOI wafer 16' is used to form membrane layer 82. In the specific embodiment in FIG. 6, a layer thickness of the at least one reinforcing layer 34 and a layer thickness of membrane layer 82 may be selected in such a way that implemented electrodes 10 and 36 have the same stiffness. A capacitor having two symmetrical membrane structures as electrodes 10 and 36 is thus achievable.

Figure 7:
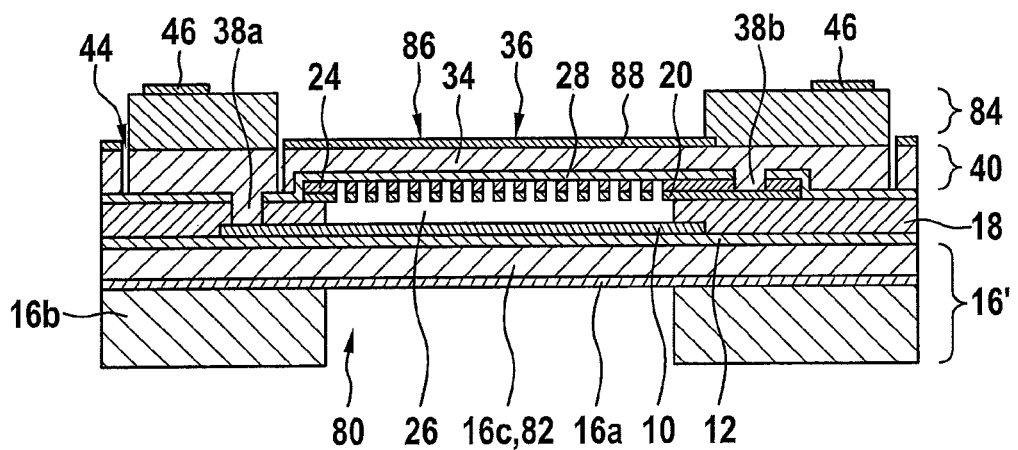
FIG. 7 shows a schematic cross section of a fourth specific embodiment of the micromechanical component.

FIG. 7 shows a schematic cross section of a fourth specific embodiment of the micromechanical component.

As a supplement to the specific embodiment described above, the micromechanical component in FIG. 7 has a flip chip structure above the at least one epi-polysilicon layer 40. For this purpose, an additional (planarized) epi-polysilicon layer 84 is deposited on the at least one epi-polysilicon layer 40. Doping may also be introduced into additional epi-polysilicon layer 84. With the aid of additional epi-polysilicon layer 84, the surface of epi-polysilicon layer 40, for example, may be placed beneath the surface of additional epi-polysilicon layer 84. In a possible flip chip installation, epi-polysilicon layer 40 may thus be protected from contact (with a printed circuit board, for example) with assistance from bond areas 46.

In addition, undesirable stiffening of second electrode 36 may be prevented with the aid of a recess 86 which is structured/etched into additional epi-polysilicon layer 84. In particular, prior to depositing additional epi-polysilicon layer 84, an etch stop layer 88, made of silicon oxide, for example, may be formed on the at least one epi-polysilicon layer 40, above second electrode 36. Thus, during etching of recess 86 through additional epi-polysilicon layer 84, no etching attack on epi-polysilicon layer 40 which could negatively influence the membrane properties may occur. In addition, due to etch stop layer 88 which may be formed as a buried etching mask, reliable protection of the at least one reinforcing layer 34 during etching of recess 86 may be ensured. Optionally, etch stop layer 88 may be removed after forming recess 86.

Figure 8:
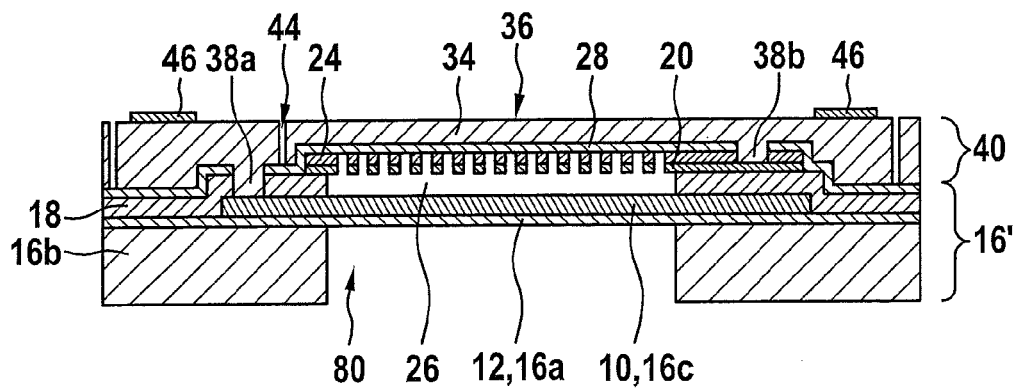
FIG. 8 shows a schematic cross section of a fifth specific embodiment of the micromechanical component.

FIG. 8 shows a schematic cross section of a fifth specific embodiment of the micromechanical component.

The micromechanical component schematically illustrated in FIG. 8 is manufactured using an SOI wafer 16' as substrate 16. First electrode 10 is formed on silicon oxide layer 16a of SOI wafer 16', which is used as first insulating layer 18, by introducing doping into semiconductor layer 16c of SOI wafer 16'. At the same time, silicon oxide layer 16a of SOI wafer 16' may also be used as an etch stop layer for etching recess 80 through rear side 52 of substrate layer 16b of SOI wafer 16'. Thus, there is no concern for nonhomogeneity in the depth of recess 80 over the substrate surface, even for different etching rates.

Figure 9:
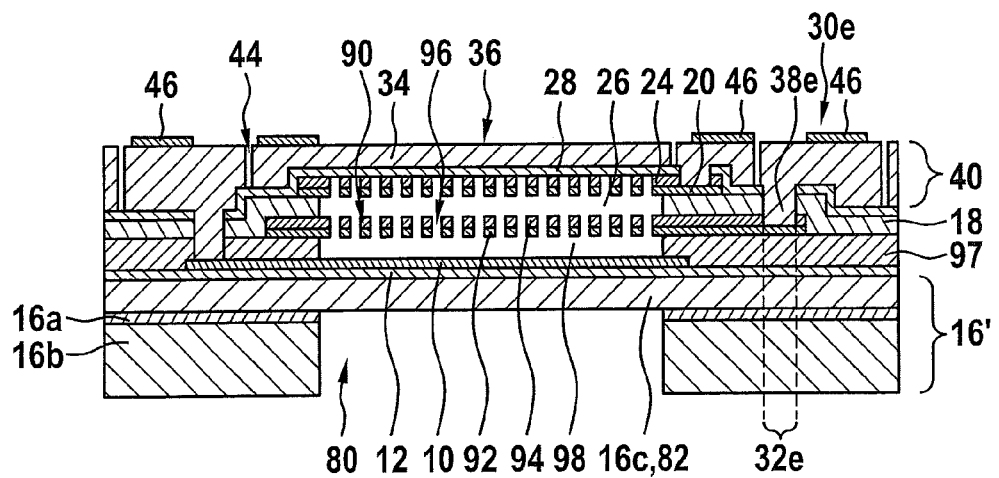
FIG. 9 shows a schematic cross section of a sixth specific embodiment of the micromechanical component.

FIG. 9 shows a schematic cross section of a sixth specific embodiment of the micromechanical component.

The micromechanical component schematically illustrated in FIG. 9 also includes, as a supplement, an intermediate electrode 90 situated between first electrode 10 and second electrode 36. Intermediate electrode 90 includes a semiconductor layer and/or metal layer 92 and optionally an additional stress compensation layer 94. Additional stress compensation layer 94 may also be a silicon nitride layer. In particular, additional stress compensation layer 94 may also be configured as an LPCVD layer. Continuous recesses 96 are structured through layers 92 and 94. With regard to the spacings and/or widths of continuous recesses 96 through layers 92 and 94, reference is made to the statements made concerning production of layer 20 which forms the inner side of second electrode 36. It is also pointed out that a single photoresist mask is usable for structuring intermediate electrode 90 and layer 20 which forms the inner side of second electrode 36.

Intermediate electrode 90 may be electrically insulated from first electrode 10 with the aid of an intermediate insulating layer 97. In addition, part of the material of intermediate insulating layer 97 may be removed to form an additional cavity 98 between first electrode 10 and intermediate electrode 90. Second insulating layer 18 may be used for electrically insulating intermediate electrode 90 with respect to second electrode 36. It is pointed out that intermediate insulating layer 97 for forming further cavity 98 together with second insulating layer 18 for forming cavity 26 may be etched in a single etching step.

A contact element 38e which electrically contacts a subsurface 32e of intermediate electrode 90 which is exposed with the aid of a contact opening 30e may be formed from the at least one epi-polysilicon layer 40. Via contact element 38e, which may be electrically contacted over bond area 46 by wire bonding, for example, intermediate electrode 90 may also be connected to an evaluation device which is situated, for example, in semiconductor layer 16c of SOI wafer 16'.

The micromechanical component in FIG. 9 may advantageously be used for a differential pressure sensor. Deflections of first electrode 10 and of second electrode 36 with respect to intermediate electrode 90 may be detected via voltages which are tapped at contact elements 38a, 38b, and 38e, and evaluated.

Figure 10:
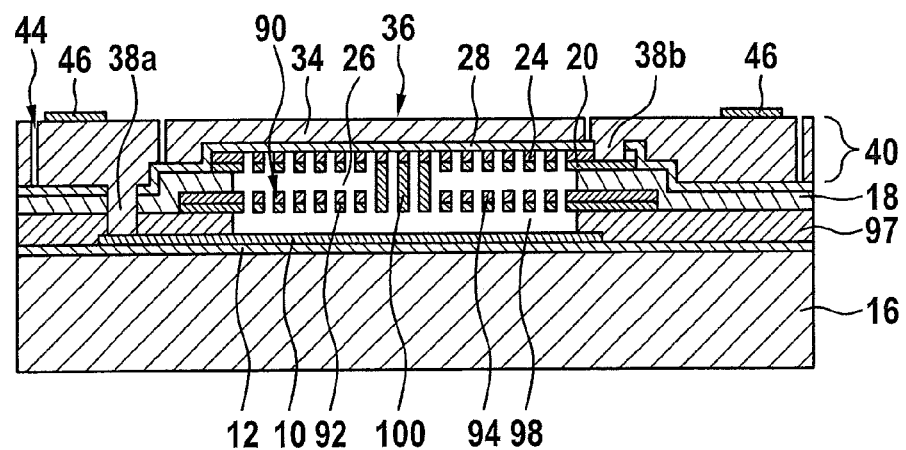
FIG. 10 shows a schematic cross section of a seventh specific embodiment of the micromechanical component.

FIG. 10 shows a schematic cross section of a seventh specific embodiment of the micromechanical component.

In the specific embodiment in FIG. 10, layer 20 which forms the inner side of second electrode 36 is connected to semiconductor layer and/or metal layer 92 of intermediate electrode 90. For this purpose, prior to applying the at least one semiconductor material and/or metal of layer 20 which forms the inner side, at least one continuous recess is etched through second insulating layer 18 (and through additional stress compensation layer 94, if present). The at least one semiconductor material and/or metal of layer 20 which forms the inner side of second electrode 36 may subsequently be deposited in such a way that at least one connecting area 100 which contacts semiconductor layer and/or metal layer 92 of intermediate electrode 90 is formed from layer 20. The at least one connecting area 100 may be configured in such a way that intermediate electrode 90 is centrally affixed to second electrode 36. As an alternative to just one connecting area 100, multiple suspension points/contact points may also be implemented between electrodes 36 and 90 via connecting areas 100.

In the micromechanical component in FIG. 10, it is reliably ensured that a concave curvature of second electrode 36 causes a movement of intermediate electrode 90 in parallel to first electrode 10. Linearization of a change of the signal tapped at contact elements 38a and 38b is achievable in this way. Thus, a linearized pressure sensor signal may also be output by a capacitive pressure sensor which is equipped with the micromechanical component.

Figure 11:
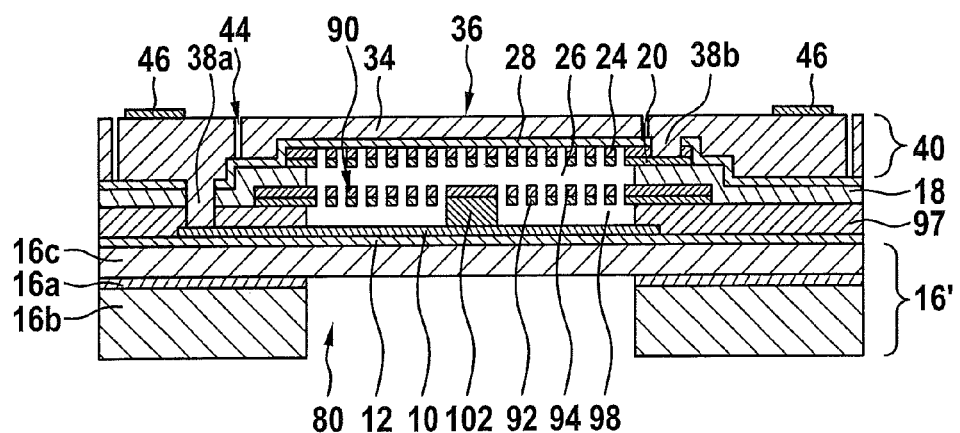
FIG. 11 shows a schematic cross section of an eighth specific embodiment of the micromechanical component.

FIG. 11 shows a schematic cross section of an eighth specific embodiment of the micromechanical component.

As schematically illustrated in FIG. 11, first electrode 10 may also be connected to intermediate electrode 90 at least via a connecting area 102 composed of the material of semiconductor layer and/or metal layer 92. For this purpose, prior to depositing the material of semiconductor layer and/or metal layer 92, a continuous recess may be structured through intermediate insulating layer 97. In this way, the above-described linearization of the tappable signal may likewise be ensured when pressure acts on first electrode 10 through recess 80 in rear side 52. For example, a single connecting area 102 composed of the material of semiconductor layer and/or metal layer 92 may be centrally connected to first electrode 10. Likewise, multiple suspension points/contact points may also be implemented between electrodes 10 and 90 via connecting areas 102.

Figure 12:
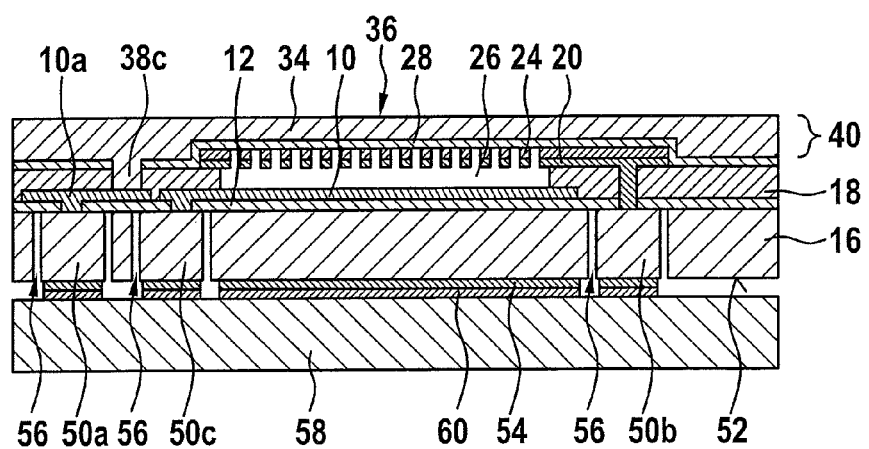
FIG. 12 shows a schematic cross section of a ninth specific embodiment of the micromechanical component.

FIG. 12 shows a schematic cross section of a ninth specific embodiment of the micromechanical component.

The micromechanical component schematically illustrated in FIG. 12 has already been described with reference to FIG. 2. In the specific embodiment illustrated in FIG. 12, the area of substrate 16 situated beneath first electrode 10 is additionally bonded/fixed to an additional substrate 58 with the aid of bond layers 54 and 60. Further stiffening of first electrode 10 may be achieved in this way.

Additional substrate 58 may include at least one circuit for operating and/or evaluating the sensor element which is formed from electrodes 10 and 36. Additional substrate 58 may in particular be an MEMS or an ASIC.

Figure 13:
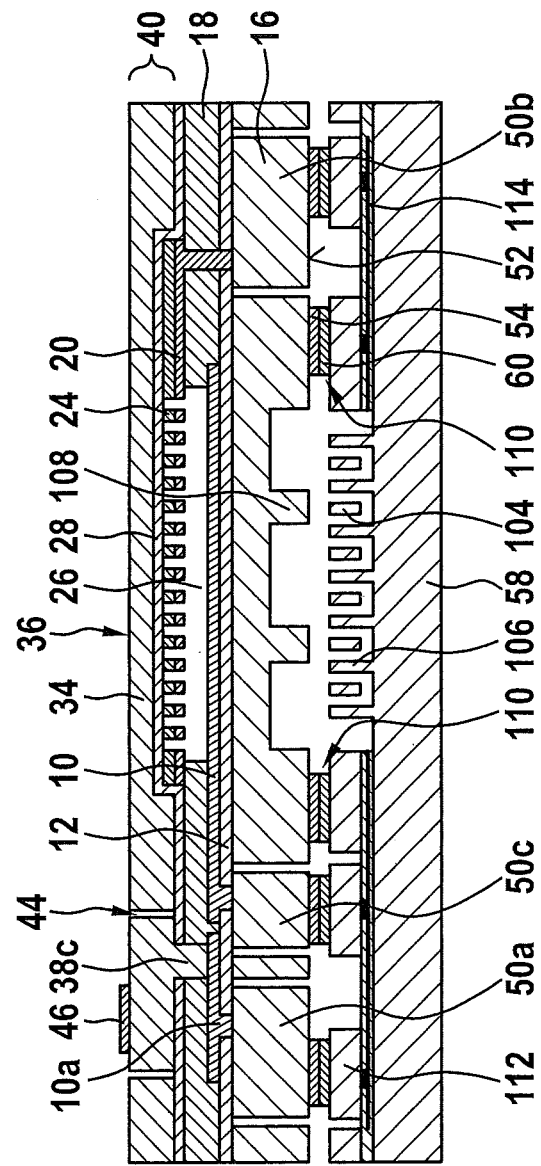
FIG. 13 shows a schematic cross section of a tenth specific embodiment of the micromechanical component.

FIG. 13 shows a schematic cross section of a tenth specific embodiment of the micromechanical component.

The variant in FIG. 13 is a refinement of FIG. 2. For this purpose, structures are formed in additional substrate 58 which in particular are usable for a further sensitive element. For example, at least one seismic mass 104 and/or at least one counter electrode 106 which is/are usable for an acceleration sensor and/or a rotation rate sensor may be structured out of additional substrate 58. Seismic mass 104 may in particular cooperate with stop structures 108 which are structured out of rear side 52 of first substrate 16. The micromechanical component may thus advantageously be used for implementing capacitive sensor devices which include a plurality of sensor elements having various configurations.

With the aid of the bond connections, a bond frame 110 may also be implemented which hermetically seals the at least one seismic mass 104 and/or the at least one counter electrode 106. Likewise, contacting of electrodes 10 and 36 may take place via contact elements 112 which are structured out of additional substrate 58 and printed conductors 114 formed in the contact elements.

Figure 14:
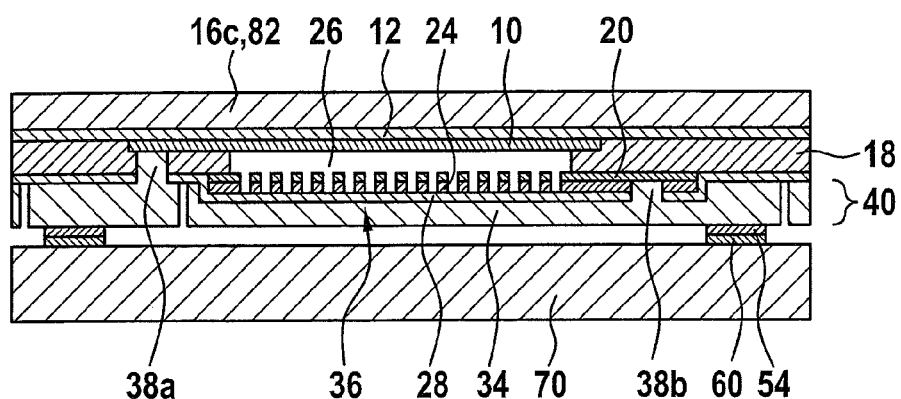
FIGS. 14, 15 and 16 show schematic cross sections of an eleventh, a twelfth, and a thirteenth specific embodiment, respectively, of the micromechanical component.
Figure 15:
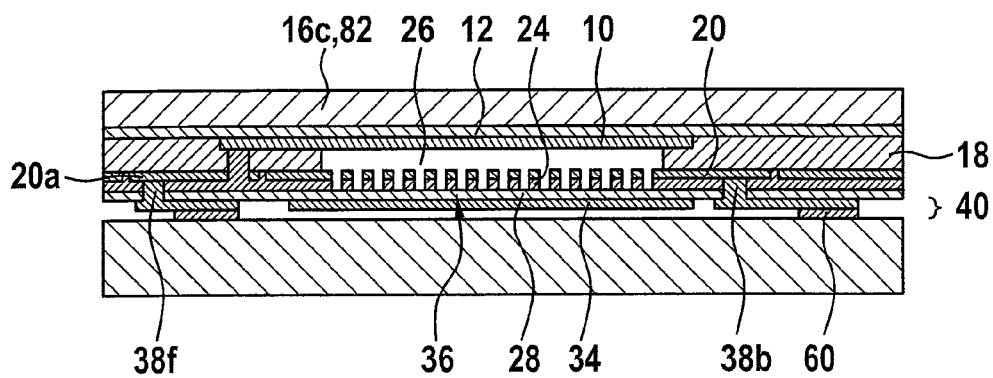
Figure 16:
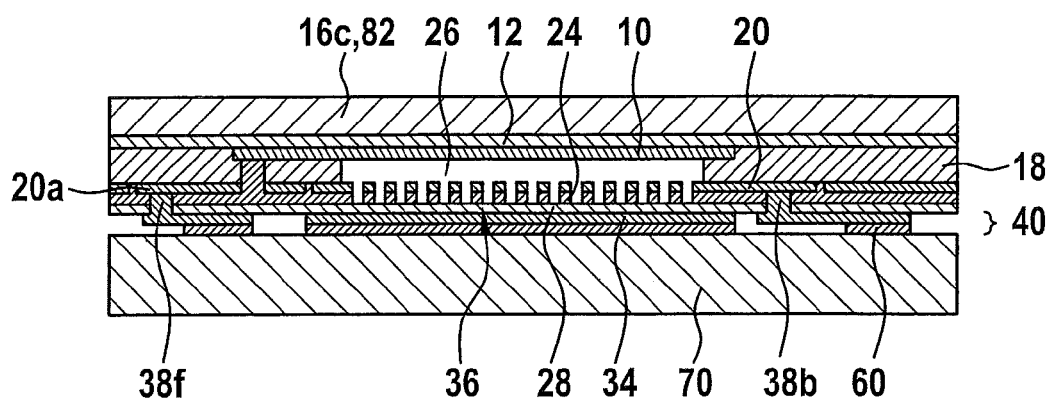

FIGS. 14 through 16 show schematic cross sections of an eleventh, a twelfth, and a thirteenth specific embodiment, respectively, of the micromechanical component.

The micromechanical components in FIGS. 14 through 16 include a second substrate 70 which is affixed to the at least one epi-polysilicon layer 40 via at least one bonded, soldered, and/or glued connection. Second substrate 70 may include at least one circuit for operating and/or evaluating the sensor element which is formed from electrons [sic; electrodes] 10 and 36. In particular, second substrate 70 may be an MEMS substrate or an ASIC substrate.

First substrate 16, which may be an SOI substrate 16', may be at least partially etched off. In particular, for etching off substrate layer 16b of SOI substrate 16', silicon oxide layer 16a of SOI substrate 16' may be used as an etch stop layer and optionally subsequently removed.

As is apparent with reference to FIGS. 15 and 16, the at least one epi-polysilicon layer 40 may also have a comparatively thin configuration. In addition, from the at least one epi-polysilicon layer 40 a contact element 38f may be formed which is electrically connected to first electrode 10 via second printed conductor 20a which is composed of second semiconductor layer and/or metal layer 21.

It is also illustrated in FIG. 16 that during affixing of an additional substrate 70, the membrane area of second electrode 36 may also be fixedly connected to additional substrate 70.

Figure 17:
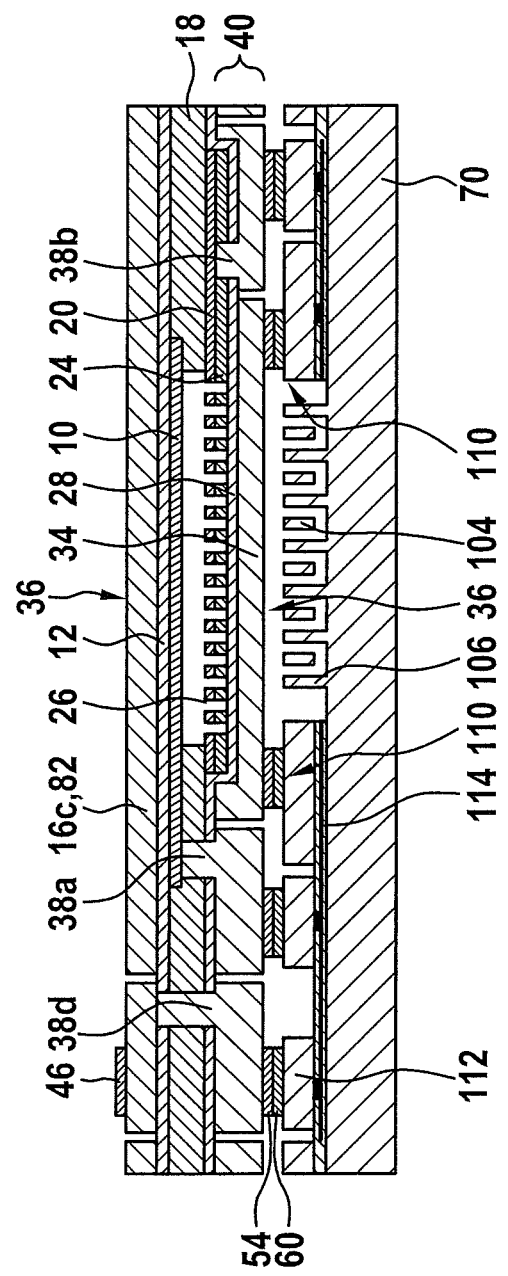
FIGS. 17 and 18 show schematic cross sections of a fourteenth and a fifteenth specific embodiment, respectively, of the micromechanical component.
Figure 18:
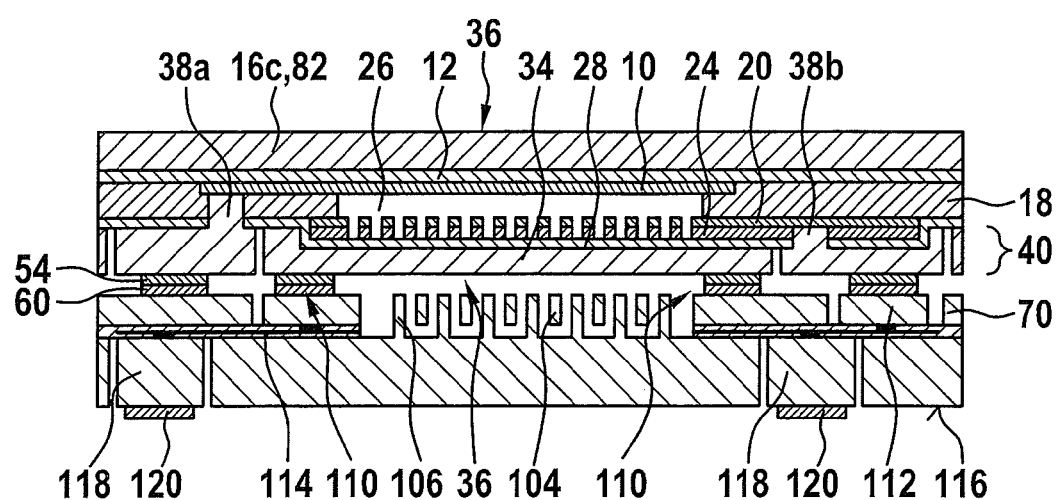

FIG. 17 and FIG. 18 show schematic cross sections of a fourteenth and a fifteenth specific embodiment, respectively, of the micromechanical component.

In these specific embodiments, in each case a seismic mass 104 and/or at least one counter electrode 106 which is/are usable for an acceleration sensor and/or a rotation rate sensor is/are structured out of second substrate 70. As is apparent with reference to FIGS. 17 and 18, an outer side of the at least one epi-polysilicon layer 40 facing away from electrodes 10 and 36 may also be used as a cap for seismic mass 104 and/or the at least one counter electrode 106. In addition, for these specific embodiments a bond frame 110 may also be formed with the aid of the bond connections.

Contact elements 112 and printed conductors 114 may also be formed in second substrate 70. The micromechanical component in FIG. 18 also includes contact elements 118 having bond pads 120 on a rear side 116 of second substrate 70 facing away from electrodes 10 and 36.

All of the above-described micromechanical components may be used in capacitive sensor devices which also include at least one further sensitive element for detecting a physical variable other than the pressure. In addition, in all of the above-described micromechanical components, a seismic mass or a paramagnetic element may also be situated on at least one of electrodes 10 and 36. The above-described micromechanical components may thus also be used for ascertaining an acceleration and/or a magnetic field strength.

What is claimed is:

1. A micromechanical component for a capacitive sensor device, comprising:
 a first electrode at least partially formed from a layer of at least one of a semiconductor material and a metal; and
 a second electrode that includes:
  a first layer, an inner side of which faces the first electrode and which is formed from a layer of at least one of a semiconductor material and a metal; and
  a second layer above the first layer;
 wherein:
  the second electrode is suspended above, and at a distance from, the first electrode so that a cavity is present between the first electrode and the second electrode;
  recesses (a) are structured into the first layer of the second electrode, and (b) are sealed off by a closure layer;
  the second layer of the second electrode:
   is a reinforcing layer that increases rigidity of the second electrode;

is formed from a layer of epi-polysilicon material; and covers at least one subarea of the closure layer; and the layer of epi-polysilicon material additionally forms at least:

a first contact element that is electrically connected to, and covers a respective surface of, one of (i) the first electrode, (ii) a first printed conductor composed of the same layer of the at least one of the semiconductor material and the metal as that of which the first electrode is made, and (iii) a conductive substrate area that is in a layer below the layer of the at least one of the semiconductor material and the metal of which the first electrode is made; and a second contact element that is electrically connected to, and covers a respective surface of, one of (i) the first layer of the second electrode and (ii) a second printed conductor composed of the same layer of the at least one of the semiconductor material and the metal as that of which the first layer of the second electrode is made.

2. The micromechanical component of claim 1, wherein the recesses form:

at least one of a lattice and mesh pattern; and in a cross section of the micromechanical component that is in a plane that cuts from a top of the micromechanical component to a bottom of the micromechanical component, a plurality of columns of the first layer of the second electrode spanning over the cavity.

3. The micromechanical component of claim 1, further comprising another epi-polysilicon layer, wherein at least one stress compensation layer is situated between the two epi-polysilicon layers, which are adjacent to each other.

4. The micromechanical component of claim 1, further comprising:

an intermediate electrode which is situated between the first electrode and the second electrode.

5. The micromechanical component of claim 1, further comprising:

a first substrate having a top side which is at least partially covered by an insulating layer, the first electrode being situated on the insulating layer.

6. The micromechanical component of claim 1, further comprising:

a second substrate which is affixed to the second layer of the second electrode layer via at least one of a bonded, soldered, and glued connection.

7. A capacitive sensor device comprising a micromechanical component for a capacitive sensor device, the micromechanical component including:

a first electrode at least partially formed from a layer of at least one of a semiconductor material and a metal; and a second electrode that includes:

a first layer, an inner side of which faces the first electrode and which is formed from a layer of at least one of a semiconductor material and a metal; and a second layer above the first layer;

wherein:

the second electrode is suspended above, and at a distance from, the first electrode so that a cavity is present between the first electrode and the second electrode;

recesses (a) are structured into the first layer of the second electrode, and (b) are sealed off by a closure layer;

the second layer of the second electrode:

is a reinforcing layer that increases rigidity of the second electrode;

is formed from a layer of epi-polysilicon material; and covers at least one subarea of the closure layer; and the layer of epi-polysilicon material additionally forms at least;

a first contact element that is electrically connected to, and covers a respective surface of, one of (i) the first electrode, (ii) a first printed conductor composed of the same layer of the at least one of the semiconductor material and the metal as that of which the first electrode is made, and (iii) a conductive substrate area that is in a layer below the layer of the at least one of the semiconductor material and the metal of which the first electrode is made; and a second contact element that is electrically connected to, and covers a respective surface of, one of (i) the first layer of the second electrode and (ii) a second printed conductor composed of the same layer of the at least one of the semiconductor material and the metal as that of which the first layer of the second electrode is made.

8. A manufacturing method for a micromechanical component for a capacitive sensor device, the method comprising:

forming a first electrode at least partially from a layer of at least one of a semiconductor material and a first metal;

depositing at least one insulating layer above the first electrode;

forming, from a layer of at least one of a semiconductor material and a metal and on the insulating layer, a first layer of a second electrode, an inner side of the first layer of the second electrode facing the first electrode, wherein recesses are structured in the first layer of the second electrode;

forming a cavity between the first electrode and the first layer of the second electrode by etching off a subarea at least of the insulating layer through the recesses;

depositing a closure layer above the first layer of the second electrode, thereby sealing off the recesses after the cavity is formed; and simultaneously forming, by deposition of a single layer of epi-polysilicon material, (a) a second layer of the second electrode over the closure layer and (b) at least a first contact element and a second contact element, wherein:

the second layer of the second electrode is positioned over at least a portion of the closure layer and is a reinforcing layer that increases rigidity of the second electrode;

the first contact element is electrically connected to, and covers a respective surface of, one of (i) the first electrode, a first printed conductor composed of the same layer of at least one of the semiconductor material and the metal as that of which the first electrode is made, and (iii) a conductive substrate area that is in a layer below the layer of the at least one of the semiconductor material and the metal of which the first electrode is made; and the second contact element is electrically connected to, and covers a respective surface of, one of (i) the first layer of the second electrode and (ii) a second printed conductor composed of the same layer of the at least one of the semiconductor material and the metal as that of which the first layer of the second electrode is made.

9. The manufacturing method of claim 8, wherein the first layer of the second electrode is at least partially covered by at least one stress compensation layer, and wherein recesses, forming at least one of a lattice and a mesh pattern matching that of the recesses structured in the first layer of the second electrode, are also structured in the stress compensation layer.

10. The manufacturing method of claim 8, wherein a second layer of epi-polysilicon material is deposited adjacent to the single layer of epi-polysilicon material, and at least one stress compensation layer is deposited between the two adjacent layers of epi-polysilicon material.

11. The manufacturing method of claim 8, wherein prior to depositing the insulating layer, an intermediate insulating layer is deposited on the first electrode, and wherein an intermediate electrode which is at least partially covered by the insulating layer is formed on the intermediate insulating layer.

12. The manufacturing method of claim 8, wherein the first electrode is formed on at least one additional insulating layer which at least partially covers a top side of a first substrate, and wherein a second substrate is affixed to the second layer of the second electrode or to another epi-polysilicon layer over the second layer of the second electrode via at least one of a bonded, soldered, and glued connection.

13. The manufacturing method of claim 12, wherein the first substrate is a silicon on insulator (SOI) wafer and a carrier layer of the SOI wafer is etched off after affixing the second substrate via the at least one of the bonded, soldered, and glued connection.

14. The manufacturing method of claim 8, wherein the etching includes an isotropic oxide plasma etching step.

15. A manufacturing method for a capacitive sensor device, the method comprising:
arranging a micromechanical component at least one of in and on the capacitive sensor device;
wherein:
the micromechanical component includes:
a first electrode at least partially formed from a layer of at least one of a semiconductor material and a metal; and
a second electrode that includes:
a first layer, an inner side of which faces the first electrode and which is formed from a layer of at least one of a semiconductor material and a metal; and
a second layer above the first layer;
the second electrode is suspended above, and at a distance from, the first electrode so that a cavity is present between the first electrode and the second electrode;
recesses (a) are structured into the first layer of the second electrode, and (b) are sealed off by a closure layer;
the second layer of the second electrode:
is a reinforcing layer that increases rigidity of the second electrode;
is formed from a layer of epi-polysilicon material; and
covers at least one subarea of the closure layer; and
the layer of epi-polysilicon material additionally forms at least:
a first contact element that is electrically connected to, and covers a respective surface of, one of (i) the first electrode, (ii) a first printed conductor composed of the same layer of the at least one of the semiconductor material and the metal as that of which the first electrode is made, and (iii) a conductive substrate area that is in a layer below the layer of the at least one of the semiconductor material and the metal of which the first electrode is made; and
a second contact element that is electrically connected to, and covers a respective surface of, one of (i) the first layer of the second electrode and (ii) a second printed conductor composed of the same layer of the at least one of the semiconductor material and the metal as that of which the first layer of the second electrode is made.

16. The micromechanical component of claim 2, wherein the second electrode includes at least one stress compensation layer between the first and second layers of the second electrode, and through which the recesses, forming at least one of a lattice or a mesh pattern matching that of the recesses structured in the first layer of the second electrode, are structured.

* * * * *